(12) United States Patent
Klein (10) Patent No.: US 10,955,754 B2
(45) Date of Patent: Mar. 23, 2021

(54) MICROLITHOGRAPHIC PROJECTION EXPOSURE APPARATUS

(71) Applicant: Carl Zeiss SMT GmbH, Oberkochen (DE)

(72) Inventor: Bertram Klein, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/750,158

(22) Filed: Jan. 23, 2020

(65) Prior Publication Data

US 2020/0241426 A1 Jul. 30, 2020

(30) Foreign Application Priority Data

Jan. 25, 2019 (DE) .................. 10 2019 200 981

(51) Int. Cl.
*G03F 7/20* (2006.01)
(52) U.S. Cl.
CPC ................ *G03F 7/70191* (2013.01)
(58) Field of Classification Search
CPC ............ G03F 7/70191; G03F 7/70225; G03F 7/70625; G03F 7/70266
USPC ................................. 355/53, 67–71
See application file for complete search history.

(56) References Cited

U.S. PATENT DOCUMENTS

| 5,710,619 A | 1/1998 | Jain et al. |
| 6,388,823 B1 | 5/2002 | Gaber et al. |
| 9,170,497 B2 * | 10/2015 | Bittner .................. G03F 7/7015 |
| 2005/0041230 A1 | 2/2005 | Otsuka |
| 2008/0128642 A1 | 6/2008 | Mos et al. |
| 2008/0210888 A1 * | 9/2008 | Inoue .................. G03F 7/70625 250/492.22 |
| 2010/0157266 A1 * | 6/2010 | Zimmermann ....... G03F 9/7026 355/53 |
| 2011/0122383 A1 | 5/2011 | Grejda et al. |
| 2013/0188246 A1 | 7/2013 | Rogalsky et al. |
| 2017/0115576 A1 | 4/2017 | Bittner et al. |

FOREIGN PATENT DOCUMENTS

DE 19827603 A1 12/1999
WO WO 2010/034674 A1 4/2010

OTHER PUBLICATIONS

German Office Action, with translation thereof, for corresponding DE Application No. 10 2019 200 981.6 dated Aug. 29, 2019.

* cited by examiner

*Primary Examiner* — Hung Nguyen
(74) *Attorney, Agent, or Firm* — Fish & Richardson P.C.

(57) ABSTRACT

A microlithographic projection exposure apparatus is configured to move a substrate stage in a scanning direction during the exposure process. The apparatus includes a projection lens for imaging mask structures onto a substrate during the exposure process with a manipulation device configured to change an imaging scale of the projection lens in at least two directions independently from one another. The apparatus also includes a control apparatus configured to perform different corrections of the imaging scale by way of suitable control of the manipulation device in the scanning direction and transversely to the scanning direction.

20 Claims, 4 Drawing Sheets

MICROLITHOGRAPHIC PROJECTION EXPOSURE APPARATUS

CROSS-REFERENCE TO RELATED APPLICATION

This application claims priority to the German Patent Application No. 10 2019 200 981.6 filed on Jan. 25, 2019. The entire disclosure of this patent application is incorporated into the present application by reference.

FIELD

The disclosure relates to a microlithographic projection exposure apparatus, which is configured to move a substrate stage in a scanning direction during an exposure process. Expressed differently, the projection exposure apparatus is embodied as a step-and-scan exposure apparatus. Furthermore, the disclosure relates to a method for controlling a projection exposure apparatus.

BACKGROUND

A projection lens with wavefront aberrations that are as small as possible is used to try to guarantee imaging of mask structures onto the wafer as precisely as possible. Therefore, projection lenses are equipped with manipulators, which render it possible to correct wavefront errors by changing the state of individual optical elements of the projection lens. Examples of such a change in state include: a change of position in one or more of the six degrees of freedom of a rigid body of the relevant optical element; application of heat and/or cold to the optical element; and a deformation of the optical element. To this end, the aberration characteristic of the projection lens is usually measured regularly and, if appropriate, changes in the aberration characteristic between the individual measurements are determined by simulation. In this regard, for example, lens element heating effects can be taken into account computationally. The manipulator changes to be carried out for the purposes of correcting the aberration characteristic are calculated via a travel-generating optimization algorithm. By way of example, such optimization algorithms are described in WO 2010/034674 A1.

If the correction of the aberration characteristic involves a correction of the imaging scale in the scanning direction, this is conventionally undertaken by adapting the scanning movement profiles of the substrate stage and of a mask stage. However, this regularly leads to the wafer image being "smudged", which is also known as "fading" in the art.

SUMMARY

The disclosure seeks to provide a projection exposure apparatus and a method for controlling a projection exposure apparatus with which the aforementioned issues are solved and, in particular, the fading effect of the wafer image is reduced or completely prevented.

According to the disclosure, a microlithographic projection exposure apparatus is configured to move a substrate stage in a scanning direction during the exposure process. The projection exposure apparatus according to the disclosure includes a projection lens for imaging mask structures onto a substrate during the exposure process with a manipulation device, which is configured to change an imaging scale of the projection lens in at least two directions independently from one another. Hence, the manipulation device is configured to change the imaging scale in directionally resolved fashion. Furthermore, the projection exposure apparatus according to the disclosure includes a control apparatus, which is configured to perform different corrections of the imaging scale by way of suitable control of the manipulation device in the scanning direction and transversely to the scanning direction.

Expressed differently, the projection exposure apparatus is configured as a step-and-scan exposure apparatus. In such a step-and-scan exposure apparatus, which is often also referred to as a "scanner", a mask and a wafer are moved relative to one another when imaging the mask onto the wafer. The imaging scale defines the ratio between the image size and the real object size of the imaged object structure, i.e., the ratio between the size of the object structure in the object plane, from which the object structure is imaged, and the size of the image of the object structure in the image plane. The control apparatus is configured to prompt the manipulation device to undertake a correction of the imaging scale in the scanning direction, the correction differing from a correction of the imaging scale transversely to the scanning direction. Consequently, this implements an asymmetric correction of the imaging scale. According to one embodiment, the imaging scale transversely to the scanning direction is an imaging scale along a direction that deviates at least 30°, in particular at least 40° or at least 60° from the scanning direction. By way of example, the imaging scale transversely to the scanning direction can be the imaging scale measured perpendicular to the scanning direction.

Different corrections of the imaging scale should be understood to mean that the correction factors used to change the imaging scale in the scanning direction and transversely thereto are different. By way of example, the correction can consist of the imaging scale being increased by 3% in the scanning direction and only being increased by 2% transversely to the scanning direction.

The correction of the imaging scale of the projection lens in the scanning direction, provided according to the disclosure, facilitates a reduction in the wafer image fading effect while simultaneously carrying out a correction of a scale error transversely to the scanning direction independently thereof.

According to one embodiment, the manipulation device is configured to change the imaging scale in the at least two directions by factors that differ from one another by at least 10%, in particular by at least 20% or by at least 30%.

According to a further embodiment, the projection lens has an anamorphic configuration. In an anamorphic projection lens, the imaging scale present without the influence of the manipulation device differs in two mutually orthogonal directions. According to one embodiment variant, the imaging scale is configured to have an 8-fold reduction in the scanning direction and a 4-fold reduction transversely to the scanning direction. The need for an asymmetric correction of the imaging scale during operation arises particularly frequently in the case of such an anamorphic projection lens. According to one embodiment of the anamorphic projection lens, the imaging scale of the projection lens that exists without the influence of the manipulation device deviates from one another in the scanning direction and transversely to the scanning direction by at least 10%. That is to say, the non-manipulated imaging scale of the projection lens differs by at least 10%, in particular by at least 20%, between the scanning direction and transversely thereto.

According to a further embodiment, the control apparatus is configured to adapt the scanning movement of the substrate stage to a scanning movement of a mask stage during the exposure process and to control an effective imaging scale of the projection exposure apparatus, produced in the process by way of different scanning speeds, in the scanning direction by way of suitable modifications in the processes of the scanning movements of the mask stage and of the substrate stage, and the control apparatus is furthermore configured to match the imaging scale of the optical projection lens in the scanning direction by way of the manipulation device to the effective imaging scale of the projection exposure apparatus, produced by way of the different scanning speeds, in the scanning direction, more particularly to set the imaging scales to the same value.

According to a further embodiment, the manipulation device includes at least one shape manipulator for asymmetrically changing the shape of an associated optical element of the projection lens. This serves to undertake an asymmetric correction of the imaging scale of the projection lens; i.e., the imaging scale is changed differently in one direction transversely to the optical axis than in a different direction transversely to the optical axis. According to one embodiment variant, the shape manipulator is configured to apply pressure to the associated optical element. This is implemented, in particular, with radially inwardly directed pressure in relation to the optical element, for example at two opposing points in the edge region of the optical element. This leads to bending of the optical element as a result of the latter being compressed from the edge.

According to a further embodiment, the optical element that is associated with the shape manipulator is not arranged near a pupil in the projection lens. Expressed differently, the optical element that is associated with the shape manipulator is not arranged in a pupil plane of the projection lens or near such a pupil plane. According to one embodiment, the relevant optical element has a subaperture ratio of no more than 0.7, in particular of no more than 0.6. As explained in US 2013/0188246 A1, for example, the subaperture diameter is given by the maximum diameter of a respective surface which is illuminated when imaging any, but specifically chosen, point of the object field on the optical element. The optically free diameter is the diameter of the smallest circle around a respective reference axis of the corresponding optical element which contains the part of the optical element illuminated when imaging the whole object field. According to a further embodiment, the optical element that is associated with the shape manipulator is arranged in near-field fashion. In a near-field arrangement of the shape manipulator, the subaperture ratio is less than 0.5, more particularly less than 0.1.

According to a further embodiment, the manipulation device furthermore includes a translation manipulator for displacing a further optical element parallel to an optical axis of the projection lens. In particular, this manipulator facilitates a symmetric correction of the imaging scale of the projection lens.

According to an embodiment variant, the optical element that is associated with the translation manipulator is not arranged near a pupil in the projection lens. Expressed differently, the optical element that is associated with the translation manipulator is not arranged in a pupil plane of the projection lens or near such a pupil plane. According to one embodiment, the relevant optical element has a subaperture ratio of no more than 0.9, in particular of no more than 0.7 or of no more than 0.6. According to a further embodiment, the optical element that is associated with the translation manipulator is arranged in near-field fashion. In a near-field arrangement, the subaperture ratio of the optical element that is associated with the translation manipulator is less than 0.5, more particularly less than 0.1.

According to a further embodiment, the manipulation device includes a plurality of movement manipulators for moving associated optical elements of the projection lens in, overall, a multiplicity of degrees of freedom of a rigid body, wherein the control apparatus is configured to move the movement manipulators using at least some of the degrees of freedom of a rigid body to effect an asymmetric correction of the imaging scale of the projection lens. In this text, this arrangement is also referred to as a "virtual manipulator".

According to a further embodiment, the control apparatus is configured to move the manipulators using at least twenty, in particular at least thirty or at least fifty, of the degrees of freedom of a rigid body so as to effect the asymmetric correction of the imaging scale.

According to a further embodiment, the projection exposure apparatus
is designed for operation in the EUV wavelength range. The above-described virtual manipulator is particularly suitable for EUV projection exposure apparatuses, in particular.

Furthermore, the disclosure provides a method for controlling a microlithographic projection exposure apparatus with a projection lens and a substrate stage. The method includes imaging mask structures onto a substrate using the projection lens during an exposure process, in which the substrate stage is moved in a scanning direction, and performing various corrections of an imaging scale of the projection lens in the scanning direction and transversely to the scanning direction by way of a manipulation device before or during the exposure process.

The features specified in respect of the embodiments, exemplary embodiments and embodiment variants, etc., of the projection exposure apparatus according to the disclosure, listed above, can be accordingly transferred to the control method according to the disclosure. These and other features of the embodiments according to the disclosure are explained in the description of the figures and in the claims. The individual features can be implemented, either separately or in combination, as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings. In the drawings.

DETAILED DESCRIPTION OF EXEMPLARY EMBODIMENTS

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
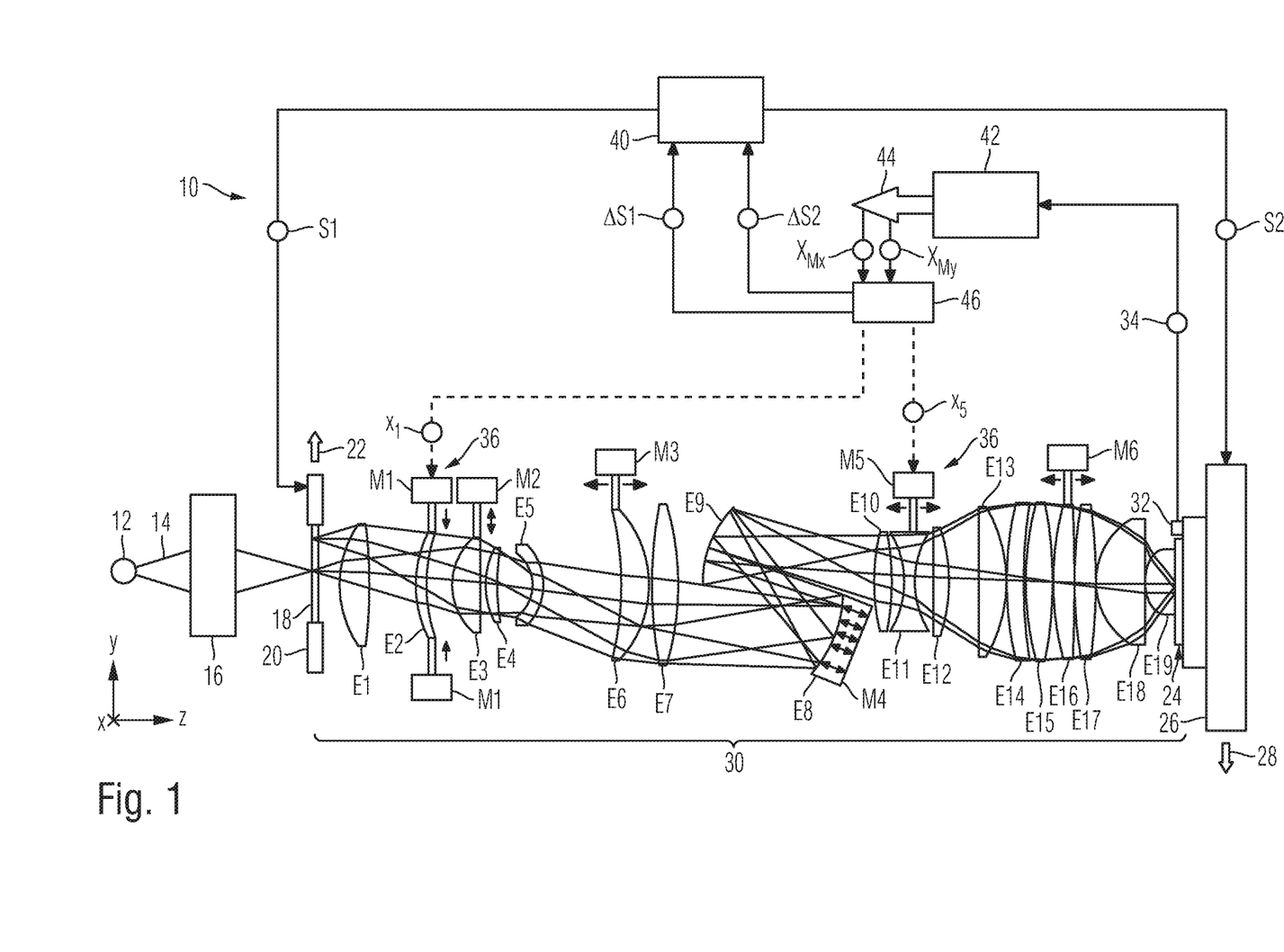
FIG. 1 shows a visualization of an embodiment of a microlithographic projection exposure apparatus according to the disclosure.

In order to facilitate the description, a Cartesian xyz-coordinate system is indicated in the drawing, from which system the respective positional relationship of the components illustrated in the figures is evident. In FIG. 1, the x-direction runs perpendicular and into the plane of the drawing, the z-direction toward the right, and the y-direction upwardly.

FIG. 1 shows an embodiment 10 according to the disclosure of a microlithographic projection exposure apparatus. The present embodiment is designed for operation in the UV wavelength range, i.e. with electromagnetic radiation of, for example, 365 nm, 248 nm or 193 nm.

The projection exposure apparatus 10 in accordance with FIG. 1 includes an exposure radiation source 12 for generating exposure radiation 14. The exposure radiation 14 firstly passes through an illumination system 16 and is directed by the latter onto a mask 18. The illumination system 16 is configured to generate different angular distributions of the exposure radiation 14 incident on the mask 18. Depending on an illumination mode desired by the user, also called "illumination setting", the illumination system 16 configures the angular distribution of the exposure radiation 14 incident on the mask 18. Examples of illumination mode settings that can be chosen include a so-called dipole illumination, annular illumination and quadrupole illumination.

The mask 18 has mask structures for imaging onto a substrate in the form of a wafer 24 and is mounted displaceably on a mask stage in the form of a mask displacement stage 20. The wafer 24 is mounted displaceably on a substrate stage in the form of a wafer displacement stage 26. The projection exposure apparatus 10 is embodied as a so-called step-and-scan exposure apparatus. The mask displacement stage 20 is moved in a scanning direction 22 and the wafer displacement stage 26 is moved in a scanning direction 28 during an exposure process in which the entire mask 18 is imaged onto the wafer 24.

Here, the movement of the displacement stages 20 and 26 is controlled by a central exposure control unit 40 via appropriate control signals S1 and S2. The scanning directions 22 and 28 of the mask displacement stage 20 and the wafer displacement stage 26, respectively, may oppose one another, as shown in the embodiment elucidated in FIG. 1. In this embodiment, the mask 18 is scanned in the positive y-direction and the wafer 24 is scanned in the negative y-direction during an exposure process. In an alternative embodiment, the scanning directions 22 and 28 can also be directed in the same way.

In the embodiment as per FIG. 1, the exposure radiation 14 passes through the mask 18 and thereupon passes through a projection lens 30, which is configured to image the mask structures onto the wafer 24. The projection lens 30 has nineteen optical elements E1 to E19 in the embodiment as per FIG. 1. The optical elements E1 to E7 and E10 to E19 are configured as transmission lens elements, and the optical elements E8 and E9 are configured as mirrors. A respective manipulator M1 to M6 is associated with the optical elements E2, E3, E6, E8, E11 and E16. The present projection lens 30 has an imaging scale of 1:4 both in the x-direction and in the y-direction; i.e., mask structures are imaged onto the wafer 24 with a reduction by a factor of four in both dimensions. According to an alternative embodiment, the projection lens 30 has an anamorphic configuration; i.e., the imaging scale in the x-direction differs from the imaging scale in the y-direction.

The manipulator M1 that is associated with the optical element E2 is configured to apply inwardly directed pressure to the edge of the optical element E2, which is embodied as a thin lens, at at least two opposite points, such that the curvature of the optical element E2 is intensified. Expressed differently, the manipulator M1 facilitates bending of the optical element E2 by compression at the edge and hence facilitates effecting of an asymmetric change in shape of the optical element E2. Therefore, the manipulator M1 is also referred to as "shape manipulator" in this document. While the compression direction can be oriented differently in principle, hereinafter for the sake of simplicity the manipulator M1 is allocated only one manipulator degree of freedom (compression in the y-direction in accordance with FIG. 1), the travel setting of which is designated by $x_1$.

The optical element E2 is arranged in the beam path of the projection lens 30 in such a way that it has a subaperture ratio of less than 0.9 and preferably of no more than 0.5. The optical element E2 is therefore not arranged near a pupil in the projection lens 30. As explained above, the subaperture ratio of an optical element is formed by the ratio of subaperture diameter and optically free diameter.

On account of the arrangement of the optical element E2 not near a pupil, the above-described asymmetric change in shape of the optical element E2, brought about via the manipulator M1, brings about an asymmetric correction of an imaging scale of the projection lens, specifically the correction of the imaging scale in the y-direction. The imaging scale defines the ratio between the image size and the real object size of the imaged object structure, i.e., the ratio between the size of the object structure in the object plane, from which the object structure is imaged, i.e., the mask plane, and the size of the image of the object structure in the image plane, i.e., the wafer plane. The imaging scale in the y-direction correspondingly defines the ratio between the image size and the real object size, respectively in the y-direction.

The manipulator M2 enables a displacement of the optical element E3 associated therewith in the x- and y-directions and thus substantially parallel to the plane in which the optical surfaces of the optical element E3 lie. That is to say that the manipulator M2 has two degrees of freedom of a rigid body, specifically a displacement in the x-direction and a displacement in the y-direction.

The manipulator M3 that is associated with the optical element E6, the manipulator M5 that is associated with the optical element E11 and the manipulator M6 that is allocated to the optical element E16 enable in each case a displacement or translation of the associated optical elements E6, E11 and E16, respectively, in the z-direction and thus substantially along the optical axis of the projection lens 30. Therefore, this is also referred to as an axial displacement. The manipulator M6 is also referred to as "translation manipulator" in this text. The manipulators M3, M5 and M6 are thus respectively allocated a manipulator degree of freedom, the travel setting of the manipulator M5 being designated by $x_5$.

In particular, the manipulator M5 facilitates a symmetric correction of the imaging scale of the projection lens 30. This is facilitated by an arrangement of the optical element E11, associated therewith, not near a pupil. To this end, the optical element E11 has a subaperture ratio of less than 0.9 and preferably of no more than 0.5.

The manipulator M4 associated with the optical element E8 that is embodied as a mirror serves for the active deformation of the mirror surface of E8 by the targeted actuation of one or more points of the mirror surface in a direction arranged transversely with respect to the mirror surface. A mirror provided with such a manipulator is also known as a deformable mirror.

Furthermore, the projection exposure apparatus 10 includes a travel ascertaining device 42, which is configured to generate, via an optimization calculation, a travel command 44 from a current state characterization 34 of the projection lens 30. The travel command 44 includes travels $X_i$. Firstly, the travels $X_i$ include correction prescriptions $X_{Mx}$ and $X_{My}$ in respect of a correction of the effective imaging scale of the projection exposure apparatus 10 in the x-direction ($X_{Mx}$) and in the y-direction ($X_{My}$). Secondly, the travels $X_i$ include further correction prescriptions, not visualized in the drawing, for the manipulators of the projection lens 30. In particular, these further correction prescriptions may include direct travel prescriptions for the manipulators M2, M3, M4 and M6 or signals from which travel prescriptions for the manipulators M2, M3, M4 and M6 are ascertained via a data processing device.

According to the embodiment elucidated in FIG. 1, the current state characterization 34 includes aberration parameters that are ascertained via a wavefront measurement at the projection lens 30. These aberration parameters are measured via a wavefront measuring device 32 that is integrated in the wafer displacement stage 26. By way of example, such a measurement can take place regularly after each exposure of a wafer or in each case after exposing a complete set of wafers. Alternatively, a simulation or a combination of simulation and reduced measurement can also be performed instead of a measurement.

When ascertaining the travel command 44, the travel ascertaining device 42 can furthermore be configured to also take account of process prescriptions that are independent of the state of the projection lens 30, which process prescriptions are also referred to as "external process prescriptions" below, in addition to the aforementioned current state characterization 34 of the projection lens 30. In particular, this applies to the ascertainment of the correction prescriptions $X_{Mx}$ and $X_{My}$ of the effective imaging scale of the projection exposure apparatus 10 in the x-direction and in the y-direction, i.e., prescriptions for an asymmetric scale correction. According to a different embodiment, the cause of such an asymmetric scale correction ($X_{Mx}$ differ from $X_{My}$) may be due to the state of the projection lens 30 and/or due to external process prescriptions; i.e., the cause may also be due to external process prescriptions only and may therefore be independent of the state characterization 34 of the projection lens 30.

An example for the desire of an asymmetric scale correction on account of external process prescriptions relates to the thermal expansion of the wafer 24, which may vary on account of slight temperature changes between various process steps and which would have to be compensated in this case, even in the case of a perfect, completely defect-free projection lens. Thus, if a layer on the wafer 24 has already been exposed at a certain temperature and if structures are hence already present thereon, and if the wafer 24 has a different temperature during the current exposure process, for instance due to a change in cleanroom and/or exposure apparatus, and if the extent of the wafer has changed as a result thereof, the imaging scale during the exposure of a further layer must be adapted in such a way that the new structures come to rest exactly on the structures that have already been applied. However, these are distorted in relation to their original state during the exposure on account of the change in thermal expansion.

Since the wafer 24 substantially expands in the radial direction in the case of a change in temperature, the desire for an asymmetric scale correction already arises purely therefrom. A field at the central upper edge of the wafer 24 will substantially experience the radial extent as a change of scale in the y-direction (vertical axis), while a field at the right or left edge of the wafer will substantially experience the radial change as a change of scale in the x-direction (horizontal axis). All ratios of the x- and y-extent lying in between and corresponding asymmetric requirements for a scale correction arise for all other fields in accordance with the projection of a radial expansion vector on the x- and y-axis.

The correction prescriptions $X_{Mx}$ and $X_{My}$ of the effective imaging scale of the projection exposure apparatus 10, ascertained by the travel ascertaining device 42, are transmitted to a control apparatus 46. The control apparatus 46 serves to implement the correction prescriptions $X_{Mx}$ and $X_{My}$ that relate to the x- and y-coordinates of the effective imaging scale of the projection exposure apparatus 10 by controlling a manipulation device 36 that includes the manipulators M1 and M5, and by transmitting correction values ΔS1 and ΔS2 to the central exposure control unit 40. The correction values ΔS1 and ΔS2 relate to corrections for the control signals S1 and S2, output by the central exposure control unit 40, to the mask displacement stage 20 and the wafer displacement stage 26, respectively. The manipulators M1 and M5 are controlled by transmitting the respective travels $x_1$ and $x_5$, respectively, by way of the control apparatus 46.

As explained in detail below with reference to FIGS. 2 to 4, the travels $x_1$ and $x_5$ and also the control signals S1 and S2 are chosen by the control apparatus 46 in such a way that the control effect thereof leads to the imaging scale of the projection lens 30 in the y-direction, i.e., in the scanning direction 22 or 28, being matched to the effective imaging scale of the projection exposure apparatus 10 in the y-direction via the manipulators M1 and M5. The effective imaging scale of the projection exposure apparatus 10 is brought about via the control signals S1 and S2 by way of prescribing different scanning speeds in the form of different scanning movement profiles for the mask displacement stage 20 and the wafer displacement stage 26.

Figure 2:
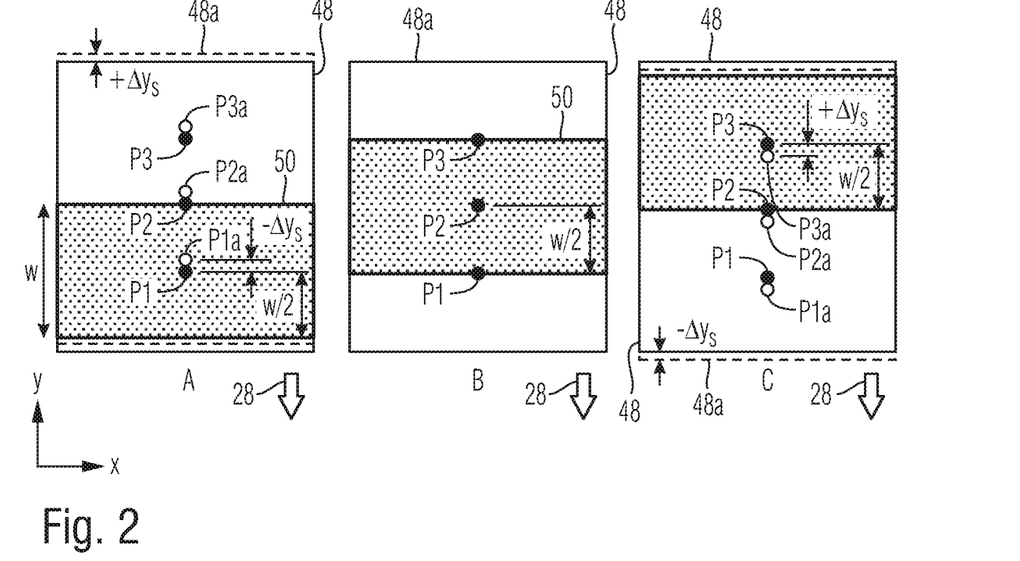
FIG. 2 shows a visualization of different scanning positions of an exposure slot during an exposure process.

FIG. 2 visualizes a field 48 on the wafer 24, exposed during an exposure process, in different scanning positions A, B and C of the wafer displacement stage 26. For orientation purposes, three field points P1, P2 and P3 are plotted in each case in the field 48 of the wafer 24. The entire mask 28 is imaged onto the field 48 in such an exposure process. Accordingly, the wafer 24 is displaced to a new wafer position and the entire mask 28 is imaged onto an adjacent further field on the wafer 24 during a further exposure process. The procedure of displacement and performance of an exposure process is implemented until substantially the entire surface of the wafer 24 has been exposed.

As already described above, the wafer displacement stage 26 is moved relative to the projection lens 30 in the scanning direction 28 during an exposure process. In the drawing, the scanning direction 28 of the wafer displacement stage 26 is oriented in the direction of the negative y-coordinate axis. On account of the displacement of the wafer 24 in the negative y-direction, the exposure field generated on the wafer 24 by the projection lens 30, which is referred to as exposure slot 50 below, moves within the field 48 in the positive y-direction, in the frame of reference of the wafer 24, during the exposure process. This movement is evident from the illustrations, visualized in FIG. 2, of the scanning positions A, B and C, which are adopted successively as time passes.

In the y-direction, the exposure slot 50 has an extent w. In the field 48 illustrated in the left-hand region of FIG. 2, the wafer displacement stage 26 is in the scanning position A at the start of the exposure process. In this scanning position, the exposure slot 50 is situated at the lower edge of the field 48 in the frame of reference of the wafer 24, to be precise in such a way that the field point P1 is arranged in the centre of the exposure slot 50 in the y-direction; i.e., the field point has the distance w/2 from the lower edge of the exposure slot 50, as visualized in FIG. 2. The field point P2 is arranged above the field point P1 by the distance w/2. Therefore, in the scanning position A, the field point P2 is at the upper edge of the exposure slot 50.

In the field 48 illustrated in the central region of FIG. 2, the wafer displacement stage 26 is in the scanning position B in the middle of the scanning movement. In this scanning position, the exposure slot 50 is arranged in the centre of the field 48 in the frame of reference of the wafer 24, to be precise in such a way that the field point P1 is arranged at the lower edge of the exposure slot 50, the field point P2 is arranged in the centre of the exposure slot 50 and the field point P3, which is positioned above the field point P2 by the distance w/2, is arranged at the upper edge of the exposure slot 50.

In the field 48 illustrated in the right-hand region of FIG. 2, the wafer displacement stage 26 is in the scanning position C at the end of the exposure process. In this scanning position, the exposure slot 50 is arranged at the upper edge of the field 48 in the frame of reference of the wafer 24, to be precise in such a way that the field point P2 is positioned at the lower edge of the exposure slot 50 and the field point P3 is positioned in the centre of the exposure slot 50.

In the case where the imaging scale requires a correction in the y-direction, the scanning movement profiles of the mask displacement stage 20 and of the wafer displacement stage 26 are altered slightly. For instance, if there should be a positive scale correction in the y-direction, i.e., if the wafer structures produced during the exposure in the lower region of the field 48 should be displaced in the negative y-direction and the wafer structures in the upper region of the field 48 should be displaced in the positive y-direction, then the scanning movement profiles of the mask displacement stage 20 and of the wafer displacement stage 26 are altered in such a way that the wafer 24 is slightly behind in comparison with the uncorrected state in the scanning position A and hence at the start of the scanning process of the mask 18. In the left-hand region of FIG. 2, this process is represented via the scan-corrected field 48a that is presented using dashed lines. Compared to the non-scan-corrected field 48 and the expo-sure slot 50, the field 48a is upwardly offset by the distance $\Delta y_s$ at the scanning position A; i.e., the field 48a trails the uncorrected state (field 48) by the distance $\Delta y_s$ in relation to the scanning direction 28 that is oriented in the negative y-direction. The points P1, P2 and P3 in the trailing field 48a are represented in the form of circular lines and denoted P1a, P2a and P3a.

However, the mask point corresponding to the point P1 is still imaged onto the wafer 24 in the centre of the exposure slot 50, i.e., imaged at the location at which the point P1 in the uncorrected state would be imaged (distance w/2 above the lower edge of the exposure slot 50). Hence, the image structure at the point P1 is effectively displaced by $\Delta y_s$ in the negative y-direction during the corrected scanning process.

In the scanning position B in the middle of the scanning process, the position of the field 48a is identical to the position of the field 48 in the uncorrected state. That is to say, the wafer 24 is synchronous with the uncorrected state in the scanning position B, i.e., the wafer no longer trails the mask 18.

By contrast, the wafer 24 somewhat leads the mask 18 in comparison with the uncorrected state in the scanning position C at the end of the scanning process. In the right-hand region of FIG. 2, this process is represented via the scan-corrected field 48a that is presented using dashed lines. Compared to the non-scan-corrected field 48 and the exposure slot, the field 48a is downwardly offset by the distance $-\Delta y_s$ at the scanning position C; i.e., the field 48a leads the uncorrected state by the distance $-\Delta y_s$ in relation to the scanning direction 28 that is oriented in the negative y-direction. The points P1, P2 and P3 in the leading field 48a are represented in the form of circular lines and denoted P1a, P2a and P3a.

However, the mask point corresponding to the point P3 is still imaged onto the wafer 24 in the centre of the exposure slot 50, i.e., imaged at the location at which the point P3 in the uncorrected state would be imaged (distance w/2 above the lower edge of the exposure slot 50). Hence, the image structure at the point P3 is effectively displaced by $\Delta y_s$ in the positive y-direction during the corrected scanning process.

Hence, there is an effective correction of the imaging scale in the y-direction, which is produced via the exposure process, by way of the above-described modification of the scanning movement profiles of the mask displacement stage 20 and the wafer displacement stage 26. As explained, the resultant imaging scale is due to the scanning movement profiles and only determined to a secondary extent by the imaging scale of the projection lens 30 itself. As a distinction to the imaging scale mentioned last, the resultant imaging scale in the scanning direction is therefore referred to as "effective imaging scale" of the projection exposure apparatus 10 in this text.

Figure 3:
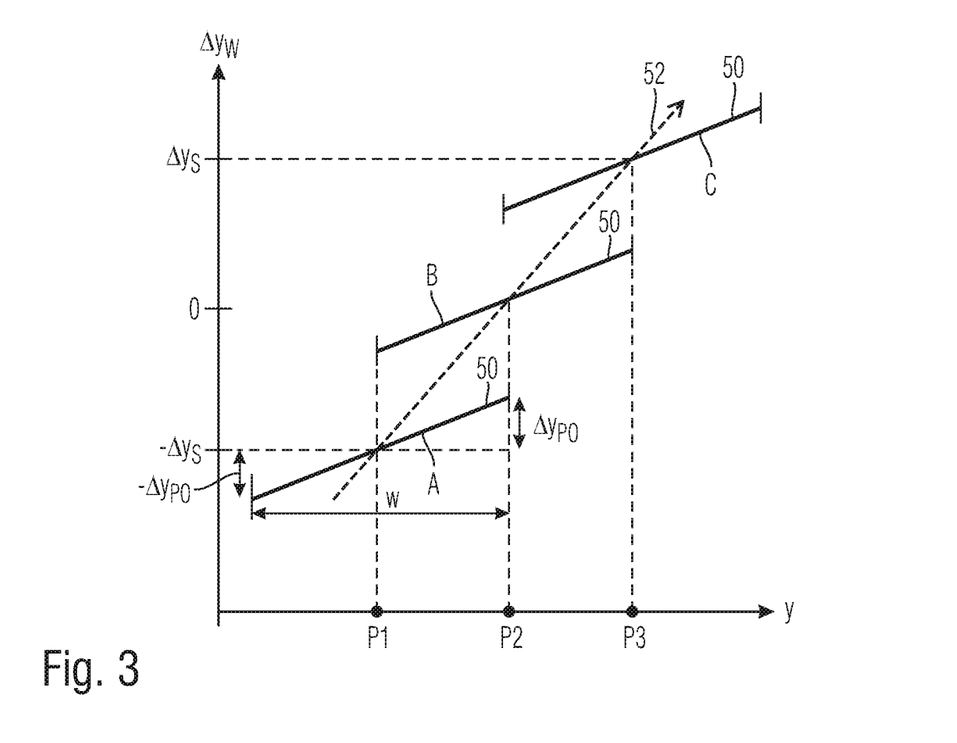
FIG. 3 shows a diagram visualizing the displacement of image points in the scanning direction as a function of the position on a wafer field, in the case of a correction of the imaging scale that is carried out according to the prior art.

The influence of the imaging scale of the projection lens 30 in the y-direction on the wafer structures produced during an imaging process is explained in FIG. 3 on the basis of a situation typically present in the prior art, where a different scale correction should be undertaken in the x-direction in comparison with the y-direction. In this situation, the predetermined scale correction in the x-direction is undertaken via a symmetric correction of the imaging scale of the projection lens 30, for example by a z-displacement of an optical element of the projection lens 30 that is arranged in near-field fashion. This correction leads to the imaging scale of the projection lens 30 in the y-direction, i.e., in the scanning direction 28, also experiencing this correction.

The change in the imaging scale of the projection lens 30 in the y-direction, occurring on account of the symmetric correction, is visible in FIG. 3 on the basis of a tilt of the lines respectively representing the extent of the exposure slot 50 in the y-direction in the various scanning positions A, B and C. In the diagram according to FIG. 3, the displacement $\Delta y_W$ of image points on the wafer 24 is illustrated in relation to a respective intended position, as a function of the y-coordinate of the wafer field 48. Plotted along the abscissa axis are the positions of the field points P1, P2 and P3 in the field 48. The aforementioned oblique lines elucidate the respective displacement $\Delta y_W$ of the image points that are produced on the wafer 24 along the y-extent of the exposure slot 50 in the respective scanning position A, B or C.

As already explained with reference to FIG. 2, the wafer point P1 lying in the centre of the exposure slot 50 is displaced by $\Delta y_w = -\Delta y_s$ in the scanning position A on account of the wafer 24 trailing as a result of the scanning profiles (cf. FIG. 3). In the scanning position B, there is no such displacement on account of the scanning profiles for the wafer point P2 then lying in the centre of the exposure slot 50, i.e., $\Delta y_w = 0$. By contrast, the wafer point P3 then lying in the centre of the exposure slot 50 is displaced by $\Delta y_w = +\Delta y_s$ in the scanning position C on account of the wafer 24 leading as a result of the scanning profiles. In the diagram according to FIG. 3, the image point displacement caused by the scanning profiles is visualized via a dashed arrow 52, which extends through the respective centres of the lines elucidating the illumination slot 50 at the scanning positions A, B and C.

As already mentioned above, the symmetric correction of the imaging scale of the projection lens 30, visualized in the present example from the prior art, brings about a respective tilt of the lines 50 in relation to the non-corrected state, in which the lines 50 would be aligned horizontally. This tilt leads to an additional displacement of the image point on the wafer by $\Delta y_{PO}$, respectively at the upper edge of the illumination slot 50 in the illustration according to FIG. 2 or at the right edge of the illumination slot 50 in the illustration according to FIG. 3. In a manner analogous thereto, there is a displacement of the corresponding image point by $-\Delta y_{PO}$ at the left edge of the illumination slot 50 in the illustration according to FIG. 3. Hence, the wafer point P2, for example, is displaced by $\Delta yw = -\Delta ys + \Delta yPO$ in the scanning position A, while this point is displaced by $\Delta y_w = 0$ in the scanning position B and displaced by $\Delta y_w = +\Delta y_s - \Delta y_{PO}$ in the scanning position C. As a result, this leads to the wafer image being "smudged", which is also known as "fading" in the art.

According to the disclosure, this image fading is prevented or at least greatly reduced by suitable setting of the x- and y-components of the imaging scale of the projection lens 30. As already explained with reference to FIG. 1, the travels $x_1$ and $x_5$ in the visualized embodiment are chosen in such a way that the imaging scale of the projection lens 30 in the y-direction are matched to the effective imaging scale, caused by the scanning profiles, of the projection exposure apparatus 10. The imaging scale of the projection lens 30 in the x-direction is set to the required correction value, independently of the y-imaging scale.

Figure 4:
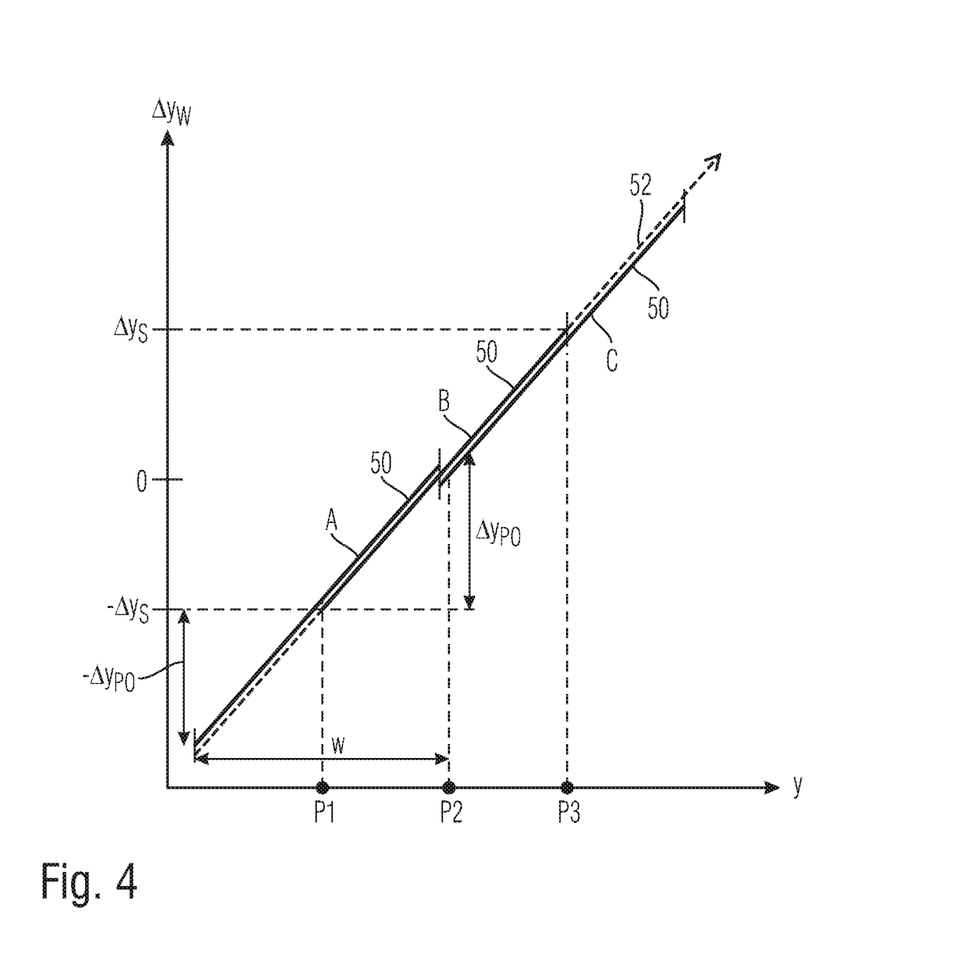
FIG. 4 shows a diagram visualizing the displacement of image points in the scanning direction as a function of the position on a wafer field, in the case of a correction of the imaging scale that is carried out according to the disclosure.

FIG. 4 visualizes the matching of the y-imaging scale of the projection lens 30 to the effective imaging scale of the projection exposure apparatus 10 according to an embodiment according to the disclosure. FIG. 4 shows the diagram of FIG. 3 with the difference that, in this case, the y-imaging scale of the projection lens 30 is chosen in such a way that the oblique lines representing the extent of the exposure slot 50 are tilted so strongly in the scanning positions A, B and C that they extend parallel to the arrow 52 that elucidates the scan-related image point displacement. Expressed differently, the y-imaging scale of the projection lens 30 is chosen in such a way in the embodiment according to FIG. 4 that the scale is identical to the effective imaging scale of the projection exposure apparatus 10 caused by the scanning profiles.

For instance, in relation to the wafer point P2, this means that there is an overall displacement of $\Delta y_W = -\Delta y_s + \Delta y_{PO} = 0$ in the scanning position A at this point, wherein the over-all displacement $\Delta y_W$ emerges from the superposition of the displacement $-\Delta y_S$ caused on account of the different scanning profiles at the scanning position A with the displacement $\Delta y_{PO}$ of the image point at the right edge of the illumination slot 50 caused on account of the y-imaging scale of the projection lens 30. In the scanning position B, the same overall displacement $\Delta y_W = 0$ arises for the wafer point P2 arranged in the centre of the exposure slot 50 since, firstly, the displacement caused by the scanning profiles equals zero and, secondly, the displacement $\Delta y_{PO}$ caused by the y-imaging scale of the projection lens 30 equals zero on account of the central position in the exposure slot 50.

As a result, matching the y-imaging scale of the projection lens 30 to the effective imaging scale of the projection exposure apparatus 10 according to FIG. 4 causes the image points on the wafer 24 to experience the same displacement at each scanning position over the entire y-extent of the exposure slot during the exposure process and hence there is no more fading like in the scanning process according to FIG. 3.

Figure 5:
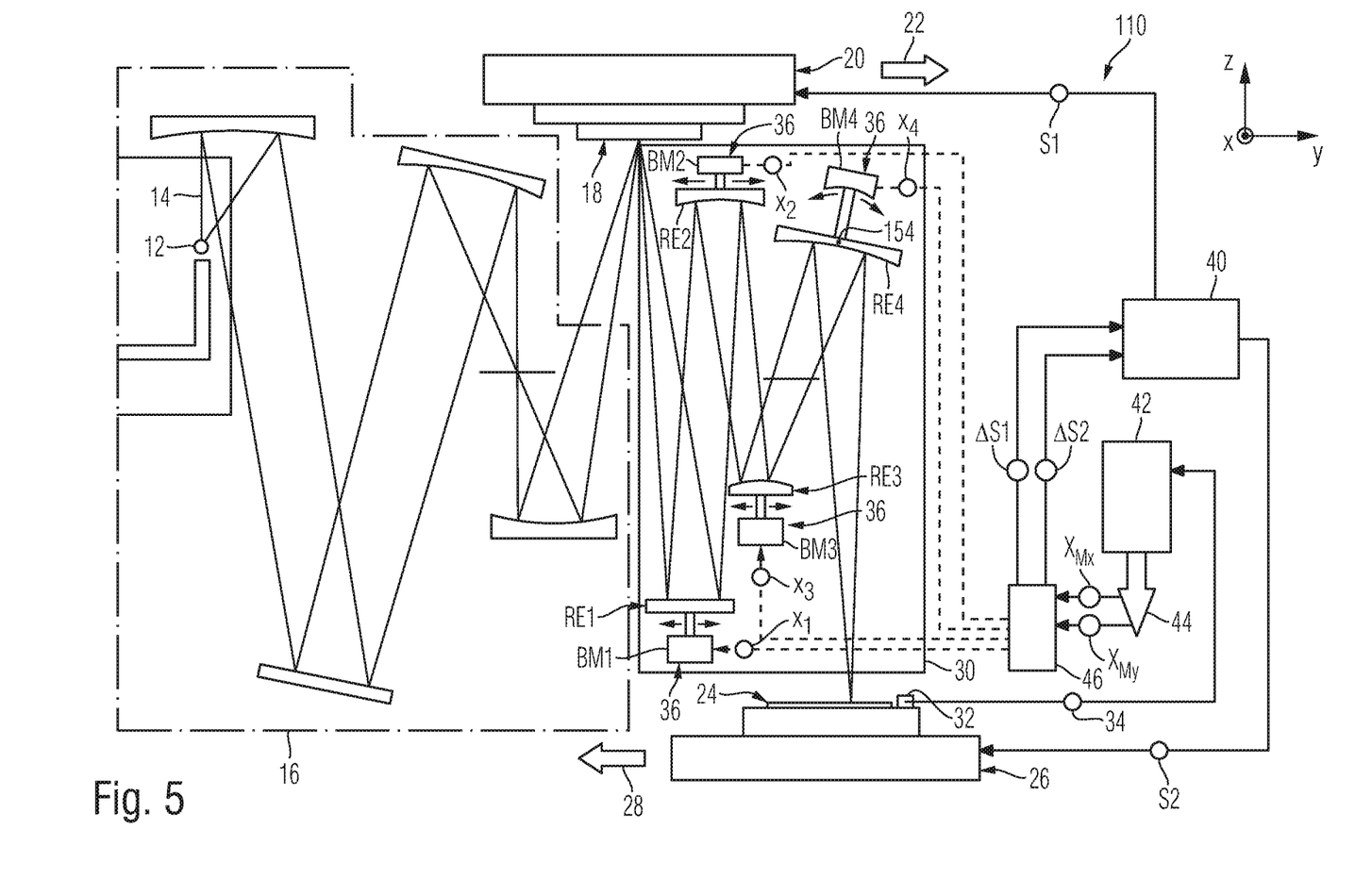
FIG. 5 shows a visualization of a further embodiment of a microlithographic projection exposure apparatus according to the disclosure.

FIG. 5 shows a further embodiment 110 according to the disclosure of a microlithographic projection exposure apparatus. The present embodiment is designed for operation in the EUV wavelength range, i.e., with electromagnetic radiation having a wavelength of less than 100 nm, in particular a wavelength of approximately 13.5 nm or approximately 6.7 nm. All optical elements are embodied as mirrors as a result of this operating wavelength.

The projection exposure apparatus 110 according to FIG. 5 includes an exposure radiation source 12 for generating exposure radiation 14 in the form of EUV radiation. To this end, the exposure radiation source 12 may include a plasma radiation source, for example. The exposure radiation 14 firstly passes through an illumination system 16 and is directed by the latter onto a mask 18. Like the illumination system as per FIG. 1, the illumination system 16 is configured to generate different angle distributions of the exposure radiation 14 incident on the mask 18.

The mask 18 has mask structures for imaging onto a substrate in the form of a wafer 24 and is mounted displaceably on a mask stage in the form of a mask displacement stage 20. As illustrated in FIG. 5, the mask 18 can be configured as a reflection mask or else, alternatively, as a transmission mask. In the embodiment according to FIG. 5, the exposure radiation 14 is reflected at the mask 18 and thereupon passes through a projection lens 30 configured to image the mask structures onto the substrate 24. The exposure radiation 14 is guided within the projection lens 30 via a multiplicity of optical elements in the form of mirrors.

The present projection lens 30 has an imaging scale of 1:4 both in the x-direction and in the y-direction; i.e., mask structures are imaged onto the wafer 24 with a reduction by a factor of four in both dimensions. According to an alternative embodiment, the projection lens 30 has an anamorphic configuration; i.e., the imaging scale in the x-direction differs from the imaging scale in the y-direction. According to one embodiment variant, the imaging scale in this case is 1:4 in the x-direction and 1:8 in the y-direction.

The wafer 24 is mounted displaceably on a substrate stage in the form of a wafer displacement stage 26. Like in the projection exposure apparatus 10 as per FIG. 1, the mask displacement stage 20 is moved in a scanning direction 22 and the wafer displacement stage 26 is moved in a scanning direction 28 during an exposure process that is carried out by the projection exposure apparatus 110, in which the entire mask 18 is imaged onto the wafer 24. Here, the movement of the displacement stages 20 and 26 is controlled by a central exposure control unit 40 via appropriate control signals S1 and S2. The scanning directions 22 and 28 of the mask displacement stage 20 and the wafer displacement stage 26, respectively, may oppose one another, as shown in the embodiment elucidated in FIG. 5. In this embodiment, the mask 18 is scanned in the positive y-direction and the wafer 24 is scanned in the negative y-direction during an illumination process.

The projection lens 30 only has four reflective optical elements RE1 to RE4 in the embodiment in accordance with FIG. 5. All optical elements are mounted in a movable manner. The projection lens furthermore includes a manipulation device 36, which includes movement manipulators to move associated optical elements of the projection lens 30 in, overall, a multiplicity of degrees of freedom of a rigid body. According to one embodiment variant, the number of degrees of freedom of a rigid body that are controllable via the manipulation device 36 can be greater than 20. In particular, each of the four optical elements RE1 to RE4 of the projection lens 30 according to FIG. 5 can be manipulable in all six degrees of freedom of a rigid body (x-, y- and z-displacement and tilting about the x-, y- and z-axis), in which case the number of degrees of freedom of a rigid body that is controllable via the manipulation device 36 totals twenty-four. According to further configurations of the projection lens 30, not illustrated in FIG. 5, the number of degrees of freedom of a rigid body can be greater than fifty or greater than one hundred.

In FIG. 5, four such degrees of freedom of a rigid body are visualized in exemplary fashion on the basis of the manipulators BM1 to BM4 embodied as movement manipulators. Here, a respective one of the manipulators BM1 to BM4 is associated with each of the optical elements RE1 to RE4. The manipulators BM1, BM2 and BM3 each enable a displacement of the assigned optical elements RE1, RE2 and RE3 in the y-direction and therefore substantially parallel to the plane in which the respective reflecting surface of the optical elements lies. Hence, each of the manipulators BM1 to BM3 facilitates a manipulation of the projection lens 30 in one degree of freedom of a rigid body.

The manipulator BM4 is configured to tilt the optical element RE4 by rotation about a tilt axis 154 disposed parallel to the y-axis. As a result, the angle of the reflecting surface of RE4 is modified in relation to the incident radiation. Further degrees of freedom for the manipulators are conceivable. Thus, for example, provision can be made for a displacement of a relevant optical element across the optical surface thereof or for a rotation about a reference axis perpendicular to the reflecting surface.

In general terms, each one of the manipulators BM1 to BM4 illustrated here is provided to bring about a displacement of the associated optical element RE1 to RE4 while performing a rigid body movement along a predetermined travel. By way of example, such a travel can combine translations in different directions, tilts and/or rotations in any manner. Alternatively or additionally, it is also possible to provide manipulators which are configured to undertake a different mannered change of a state variable of the associated optical element by an appropriate actuation of the manipulator. In this respect, an actuation can be carried out by, e.g., applying a specific temperature distribution or a specific force distribution to the optical element. In this case, the travel can be as a result of a modification of the temperature distribution on the optical element or the application of local tension to an optical element embodied as a deformable lens or as a deformable mirror.

A wavefront measuring device 32 is integrated in the wafer displacement stage 26, the wavefront measuring device serving for the measurement of a current state characterization 34 of the projection lens 30, for instance in the form of aberration parameters. Furthermore, the projection exposure apparatus 110 includes a travel ascertaining device 42, which is configured to ascertain, via an optimization calculation, a travel command 44 from the current state characterization 34 of the projection lens 30. As already explained with respect to FIG. 1, the travel command 44 includes travels $X_i$. Firstly, the travels $X_i$ include correction prescriptions $X_{Mx}$ and $X_{My}$ in respect of a correction of the effective imaging scale of the projection exposure apparatus 110 in the x-direction ($X_{Mx}$) and in the y-direction ($X_{My}$). Secondly, the travels $X_i$ include further correction prescriptions, not visualized in the drawing, for the manipulators BM1 to BM4 of the projection lens 30.

The correction prescriptions $X_{Mi}$, and $X_{My}$ of the effective imaging scale of the projection exposure apparatus 110, ascertained by the travel ascertaining device 42, are transmitted to a control apparatus 46. The control apparatus 46 serves to implement the correction prescriptions $X_{Mx}$ and $X_{My}$ that relate to the x- and y-coordinates of the effective imaging scale of the projection exposure apparatus 110 by the manipulation device 36 that includes the manipulators BM1 to BM4, and by transmitting correction values $\Delta S1$ and $\Delta S2$ to the central exposure control unit 40. The correction values $\Delta S1$ and $\Delta S2$ relate to corrections for the control signals S1 and S2, output by the central exposure control unit 40, to the mask displacement stage 20 and the wafer displacement stage 26, respectively. The manipulators BM1 to BM4 are controlled by transmitting a respective travel $x_i$ for each of the degrees of freedom of a rigid body by way of the control apparatus 46. In the present simplified case serving visualization purposes, the travels $x_1$ to $x_4$ are transmitted.

The travels $x_i$ and the control signals S1 and S2 are chosen by the control apparatus 46 in such a way that the control effect thereof leads to the imaging scale of the projection lens 30 in the y-direction, i.e., in the scanning direction 22 or 28, being matched to the effective imaging scale of the projection exposure apparatus 110 in the y-direction via the manipulators BM1 to BM4. The effective imaging scale of the projection exposure apparatus 110 is brought about via the control signals S1 and S2 by way of prescribing different scanning speeds in the form of different scanning movement profiles for the mask displacement stage 20 and the wafer displacement stage 26.

The effect of matching the imaging scale of the projection lens 30 in the y-direction to the effective y-imaging scale of the projection exposure apparatus, caused via the different scanning movement profiles, was already explained above with reference to FIGS. 2 to 4. Since the correction of the imaging scale of the projection lens 30 in the x-direction is predetermined by the measured state characterization 34 and/or external process prescriptions, a manipulability of the y-imaging scale that is independent of the x-imaging scale according to the correction prescriptions $X_{Mx}$ and $X_{My}$ is desirable for matching the y-imaging scale of the projection lens 30. Expressed differently, the possibility of an asymmetric correction of the imaging scale of the projection lens 30 is involved.

However, as a matter of principle, none of the degrees of freedom of a rigid body that are controllable by the control apparatus 46 are suitable, on their own, for bringing about an asymmetric correction of the imaging scale of the desired order of magnitude. However, changes in the travel at at least some of the degrees of freedom of a rigid body each bring about small asymmetric changes in the imaging scale as a secondary effect, in addition to the imaging aberration corrections primarily brought about thereby. In the present embodiment, the travels $x_i$ are determined by the control apparatus 46 in such a way that these asymmetric changes in the imaging scale, caused as a secondary effect, add in suitable fashion while, however, the respective imaging aberration corrections, caused as a primary effect, cancel one another at the same time. Here, preferably at least twenty, in particular at least thirty or at least fifty, degrees of freedom of a rigid body are suitably manipulated by the control apparatus 46 for setting the correction prescriptions $X_{Mx}$ and $X_{My}$. In this text, the manipulation device 36 with the control apparatus 46 configured thus is also referred to as "virtual manipulator".

As a result of setting of the correction prescriptions $X_{Mx}$ and $X_{My}$ in the projection lens 30 of the projection exposure apparatus 110 according to FIG. 5, brought about by using the virtual manipulator, the operation already described with reference to the projection exposure apparatus 10 as per FIG. 1 is facilitated, according to which matching of the imaging scale of the projection lens 30 in the y-direction to the effective y-imaging scale of the projection exposure apparatus 110 is brought about via the different scanning movement profiles. Therefore, in respect of further details of this operation, reference is made to the description, provided above, in respect of the projection exposure apparatus 10.

The above description of exemplary embodiments, embodiments or embodiment variants is to be understood to be by way of example. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, insofar as they fall within the scope of the disclosure in accordance with the definition in the accompanying claims, and equivalents are intended to be covered by the protection of the claims.

The disclosure encompasses the aspects described in the following clauses. These clauses form part of the description and are not claims:

Clause 1: A microlithographic projection exposure apparatus (10; 110), which is configured to move a substrate stage (26) in a scanning direction (28) during the exposure process and includes:
- a projection lens (30) for imaging mask structures onto a substrate (24) during the exposure process with a manipulation device (36), which is configured to change an imaging scale of the projection lens in at least two directions independently from one another, and
- a control apparatus (46), which is configured to perform different corrections of the imaging scale by way of suitable control of the manipulation device in the scanning direction and transversely to the scanning direction.

Clause 2: The projection exposure apparatus according to Clause 1,
in which the manipulation device (36) is configured to change the imaging scale in the at least two directions by factors that differ from one another by at least 10%.

Clause 3: The projection exposure apparatus according to Clause 1 or 2,
in which the projection lens (30) has an anamorphic configuration.

Clause 4: The projection exposure apparatus according to Clause 3,
in which the imaging scale of the projection lens (30) that exists without the influence of the manipulation device (36) deviates from one another in the scanning direction (28) and transversely to the scanning direction by at least 10%.

Clause 5: The projection exposure apparatus according to one of the preceding Clauses, in which the control apparatus (46) is configured to adapt the scanning movement of the substrate stage (26) to a scanning movement of a mask stage (20) during the exposure process and to control an effective imaging scale of the projection exposure apparatus (10; 110), produced in the process by way of different scanning speeds, in the scanning direction by way of suitable modifications in the processes of the scanning movements of the mask stage and of the substrate stage, and the control apparatus is furthermore configured to match the imaging scale of the optical projection lens (30) in the scanning direction (28) by way of the manipulation device (36) to the effective imaging scale of the projection exposure apparatus, produced by way of the different scanning speeds, in the scanning direction.

Clause 6: The projection exposure apparatus according to one of the preceding Clauses, in which the manipulation device (36) includes at least one shape manipulator (M1) for asymmetrically changing the shape of an associated optical element (E1) of the projection lens.

Clause 7: The projection exposure apparatus according to Clause 6,
in which the shape manipulator (M1) is configured to apply pressure to the associated optical element (E1).

Clause 8: The projection exposure apparatus according to Clause 6 or 7,
in which the optical element (E1) that is associated with the shape manipulator (M1) is not arranged near a pupil in the projection lens (30).

Clause 9: The projection exposure apparatus according to one of Clauses 6 to 8,
in which the manipulation device (36) furthermore includes a translation manipulator (M5) for displacing a further optical element parallel to an optical axis of the projection lens.

Clause 10: The projection exposure apparatus according to Clause 9,
in which the optical element (E11) that is associated with the translation manipulator (M5) is not arranged near a pupil in the projection lens (30).

Clause 11: The projection exposure apparatus according to one of Clauses 1 to 5,
in which the manipulation device (36) includes a plurality of movement manipulators (BM1-BM4) for moving associated optical elements (RE1-RE4) of the projection lens (30) in, overall, a multiplicity of degrees of freedom of a rigid body, wherein the control apparatus (46) is configured to move the movement manipulators using at least some of the degrees of freedom of a rigid body to effect an asymmetric correction of the imaging scale of the projection lens.

Clause 12: The projection exposure apparatus according to Clause 11, in which the control apparatus (46) is configured to move the manipulators (BM1-BM4) using at least twenty of the degrees of freedom of a rigid body so as to effect the asymmetric correction of the imaging scale.

Clause 13: The projection exposure apparatus according to one of the preceding Clauses, which is designed for operation in the EUV wavelength range.

Clause 14: A method for controlling a microlithographic projection exposure apparatus (10; 110) with a projection lens (30) and a substrate stage (26), including:
imaging mask structures onto a substrate (24) using the projection lens during an exposure process, in which the substrate stage is moved in a scanning direction (28), and
performing various corrections of an imaging scale of the projection lens in the scanning direction and transversely to the scanning direction by way of a manipulation device (36) before or during the exposure process.

LIST OF REFERENCE SIGNS

10 Projection exposure apparatus
12 Exposure radiation source
14 Exposure radiation
16 Illumination system
18 Mask
20 Mask displacement stage
22 Scanning direction of the mask displacement stage
24 Wafer
26 Wafer displacement stage
28 Scanning direction of the wafer displacement stage
30 Projection lens
32 Wavefront measuring device
34 State characterization
36 Manipulation device
40 Central exposure control unit
42 Travel ascertaining device
44 Travel command
46 Control apparatus
48 Field on wafer
48a Scan-corrected field
50 Exposure slot
52 Scan-related image point displacement
110 Projection exposure apparatus
154 Tilt axis
S1 Control signal to the mask displacement stage
S2 Control signal to the wafer displacement stage
ΔS1 Correction value for control signal S1
ΔS2 Correction value for control signal S2
M1 to M5 Manipulators
$x_1, x_2, x_3, x_4, x_5$ Travel settings
E1 to E19 Optical elements
BM1 to BM4 Movement manipulators
RE1 to RE4 Reflective optical elements

What is claimed is:

1. An apparatus configured to move a substrate stage in a scanning direction during an exposure process, the apparatus comprising:
a projection lens configured to image mask structures onto a substrate during the exposure process;
a manipulation device configured to change an imaging scale of the projection lens in at least two directions independently from each other; and
a control apparatus configured to:
perform different corrections of the imaging scale via control of the manipulation device in the scanning direction and transversely to the scanning direction,
adapt a scanning movement of a substrate stage to a scanning movement of a mask stage during the exposure process;
control an effective imaging scale of the apparatus, produced in the exposure process via different scanning speeds, in the scanning direction via modifications in the processes of the scanning movements of the mask stage and of the substrate stage; and
match the imaging scale of the projection lens in the scanning direction via the manipulation device to the effective imaging scale of the apparatus, produced via the different scanning speeds, in the scanning direction to reduce a fading effect in the image of the mask structures produced by the different scanning speeds of the mask stage and the substrate stage,
wherein the apparatus is a microlithographic projection exposure apparatus.

2. The apparatus of claim 1, wherein the manipulation device is configured to change the imaging scale in the at least two directions by factors that differ from each other by at least 10%.

3. The apparatus of claim 1, wherein the projection lens has an anamorphic configuration.

4. The apparatus of claim 3, wherein an imaging scale of the projection lens without the influence of the manipulation device deviates in the scanning direction and transversely to the scanning direction by at least 10%.

5. The apparatus of claim 1, wherein the control apparatus is configured to set the imaging scales to the same value.

6. The apparatus of claim 1, wherein the projection lens comprises an optical element, and the manipulation device comprises a shape manipulator configured to asymmetrically change a shape of the optical element.

7. The apparatus of claim 6, wherein the shape manipulator is configured to apply pressure to the optical element.

8. The apparatus of claim 6, wherein the optical element is not arranged near a pupil in the projection lens.

9. The apparatus of claim 1, wherein:
the projection lens comprises optical elements;
the manipulation device comprises a plurality of movement manipulators configured to move the optical elements in, overall, a multiplicity of degrees of freedom of a rigid body; and
the control apparatus is configured to move the movement manipulators using at least some of the degrees of freedom of a rigid body to effect an asymmetric correction of the imaging scale of the projection lens.

10. The apparatus of claim 9, wherein the manipulation device comprises a translation manipulator configured to displace an associated optical element parallel to an optical axis of the projection lens, and the optical element that is associated with the translation manipulator is not arranged near a pupil in the projection lens.

11. The apparatus of claim 1, wherein the apparatus is an EUV microlithographic projection exposure apparatus.

12. The apparatus of claim 1, wherein the different scanning speeds of the mask stage and the substrate stage are configured as different scanning movement profiles for the mask stage and the substrate stage.

13. The apparatus of claim 1, further comprising an illumination system configured to illuminate the mask structures.

14. The apparatus of claim 13, wherein the apparatus is an EUV microlithographic projection exposure apparatus.

15. The apparatus of claim 14, wherein the different scanning speeds of the mask stage and the substrate stage are configured as different scanning movement profiles for the mask stage and the substrate stage.

16. The apparatus of claim 13, wherein the apparatus is a UV microlithographic projection exposure apparatus.

17. The apparatus of claim 16, wherein the different scanning speeds of the mask stage and the substrate stage are configured as different scanning movement profiles for the mask stage and the substrate stage.

18. A method of using a microlithographic projection exposure apparatus comprising an illumination system and a projection lens, the method comprising:
   using the illumination system to illumination mask structures; and
   using the projection lens to image the illuminated mask structures onto a substrate,
   wherein the microlithographic projection exposure apparatus is an apparatus according to claim 1.

19. The method of claim 18, wherein the apparatus is an EUV microlithographic projection exposure apparatus.

20. The method of claim 18, wherein the apparatus is a UV microlithographic projection exposure apparatus.

* * * * *